United States Patent [19]

Sutrina

[11] Patent Number: 4,631,573

[45] Date of Patent: Dec. 23, 1986

[54] COOLED STACK OF ELECTRICALLY ISOLATED SEMICONDUCTORS

[75] Inventor: Thomas A. Sutrina, Rockford, Ill.

[73] Assignee: Sundstrand Corporation, Rockford, Ill.

[21] Appl. No.: 738,057

[22] Filed: May 24, 1985

[51] Int. Cl.[4] .......................... H04N 9/02; H02B 1/00; F28F 7/00; H01B 7/34

[52] U.S. Cl. ........................................ 357/82; 357/80; 357/81; 357/75; 174/15 HP; 174/16 HS; 361/381; 361/382; 165/80.4; 165/80.5

[58] Field of Search ....................... 357/81, 82, 75, 76, 357/80; 174/47, 15 R, 15 HP, 16 HS, 17 LF; 165/80.4, 80.5; 361/381, 382, 385, 388, 389; 372/36

[56] References Cited

U.S. PATENT DOCUMENTS

| | | | |
|---|---|---|---|
| 3,509,429 | 4/1970 | Craig et al. | 357/81 |
| 3,771,031 | 11/1973 | Kay | 357/76 |
| 4,268,850 | 5/1981 | Lazarek et al. | 357/82 |
| 4,392,153 | 7/1983 | Glascock, II et al. | 357/82 |

FOREIGN PATENT DOCUMENTS 0055171 5/1979 Japan ..................................... 357/76

Primary Examiner—James W. Davie
Assistant Examiner—Georgia Y. Epps
Attorney, Agent, or Firm—Wood, Dalton, Phillips, Mason & Rowe

[57] ABSTRACT

Electrical isolation of semiconductors in a stack with interposed heat sinks is attained through the use of a thin sheet 30 of electrical insulating material disposed between first and second, electrically conductive heat sink elements 26, 28, each having a planar surface 32, 34 and an opposite surface 12, 14 configured to make good electrical and thermal contact with a semiconductor 16, 18, 20. Each heat sink element 26, 28 has a pair of ports 42, 44, 46 that may act as inlets or outlets and an internal conduit 54 interconnecting the same. The conduit 54 is in heat transfer relation to the sides 12 and 14 and the elements 26, 28 sandwich the sheets 30 between the planar sides 32 and 34. Adhesive 88, 90 bonds the planar surfaces 32 and 34 to the sheet 30.

12 Claims, 7 Drawing Figures

COOLED STACK OF ELECTRICALLY ISOLATED SEMICONDUCTORS

FIELD OF THE INVENTION

This invention relates to semiconductor assemblies, and more specifically, to a construction for cooling semiconductors stacked upon one another while allowing the semiconductors to be electrically isolated from each other.

BACKGROUND OF THE INVENTION

In recent years, it has become common to stack semiconductors, particularly high power semiconductors, in an operative assembly for any of a variety of reasons. In some cases, the motivating desire may be providing a compact assembly of semiconductors while in others, the motivating desire may be related to minimizing the distance that a control signal has to pass to more than one semiconductor to assure that the semiconductors are controlled as close to absolutely simultaneously as possible.

In any event, during operation of the circuits including such semiconductors, heat is generated and efforts must be made to remove the heat to prevent damage to the semiconductors.

Commonly, heat sinks and/or various cooling schemes have been employed for the purpose. In most instances, such components are metallic to provide good thermal conductivity and as a consequence, are electrical conductors. Consequently, where the semiconductors in a stack must be electrically isolated from one another, electrical insulators must be interposed at various locations in the stack. Many electrical insulators are poor conductors of heat and thus may interfere with efficient cooling of the various semiconductors.

The present invention is directed to providing a new and improved cooling and heat sink structure for use in semiconductor stacks which provides high thermal efficiency while allowing the semiconductors in the stack to be operated at differing electrical potentials by reason of electrical isolation of the semiconductors from one another.

SUMMARY OF THE INVENTION

It is a principal object of the invention to provide a new and improved heat sink structure and a new and improved semiconductor stack employing the same. More specifically, it is an object of the invention to provide such a heat sink structure that lends itself to use in compact semiconductor stacks and yet provides for electrical isolation of the individual semiconductor elements in the stack without impeding heat transfer efficiency required for cooling purposes.

An exemplary embodiment of the invention achieves the foregoing objects in a heat sink structure including a thin sheet of electrical insulating material and first and second electrically conductive heat sink elements. Each sink element has a planar surface and an opposite side configured to make good electrical and thermal contact with a semiconductor. Each heat sink element further includes a fluid inlet and a fluid outlet spaced from the inlet along with an internal conduit interconnecting the inlet and the outlet. The conduit is in heat transfer relation to the side of the element opposite the planar side and the elements sandwich the insulating sheet between the planar surfaces. Means are provided to bond the planar surfaces to the sheet.

In a preferred embodiment, the inlets and outlets are defined by necks extending away from their respective planar surfaces with the necks on one of the elements being aligned with the necks on the other element.

In a highly preferred embodiment, at least one neck on one element has a through bore aligned with a through bore in the aligned neck on the other element. An aperture is located in the insulating sheet and is aligned with the through bores. Each of the through bores, adjacent the sheet, is provided with a relief and dielectric material is disposed in the reliefs.

In a highly preferred embodiment, the dielectric material is an adhesive which further serves as the bonding means.

The invention further contemplates a semiconductor stack comprising a plurality of "X" heat sink structures as described above in aligned but spaced relation and a plurality of "X-1" semiconductors, each semiconductor being disposed between two of the heat sink structures and engaging one of the said opposite sides of each. Clamping means act on the endmost ones of the heat sink structures in the stack to clamp the heat sink structures and semiconductors in assembled relation. Tubes are sealingly received in facing necks of adjacent heat sink structures in the stack to establish a flow path or paths for coolant through the conduits in the stack.

In a preferred embodiment of the stack, the tubes have opposed ends received in the necks and peripheral, outwardly opening grooves adjacent the opposed ends. O-ring seals are disposed in such grooves.

The invention contemplates that the planar surfaces of the heat sink elements be substantially identical in size and shape and the sheet be of similar shape and somewhat greater in size so as to extent beyond the periphery of the planar surfaces around the entire periphery of the heat sink elements.

Dielectric material may be located on the sheet and about the periphery thereof and extends to the periphery of the heat sink elements.

Other objects and advantages will become apparent from the following specification taken in connection with the accompanying drawings.

DESCRIPTION OF THE PREFERRED EMBODIMENT

Figure 1:
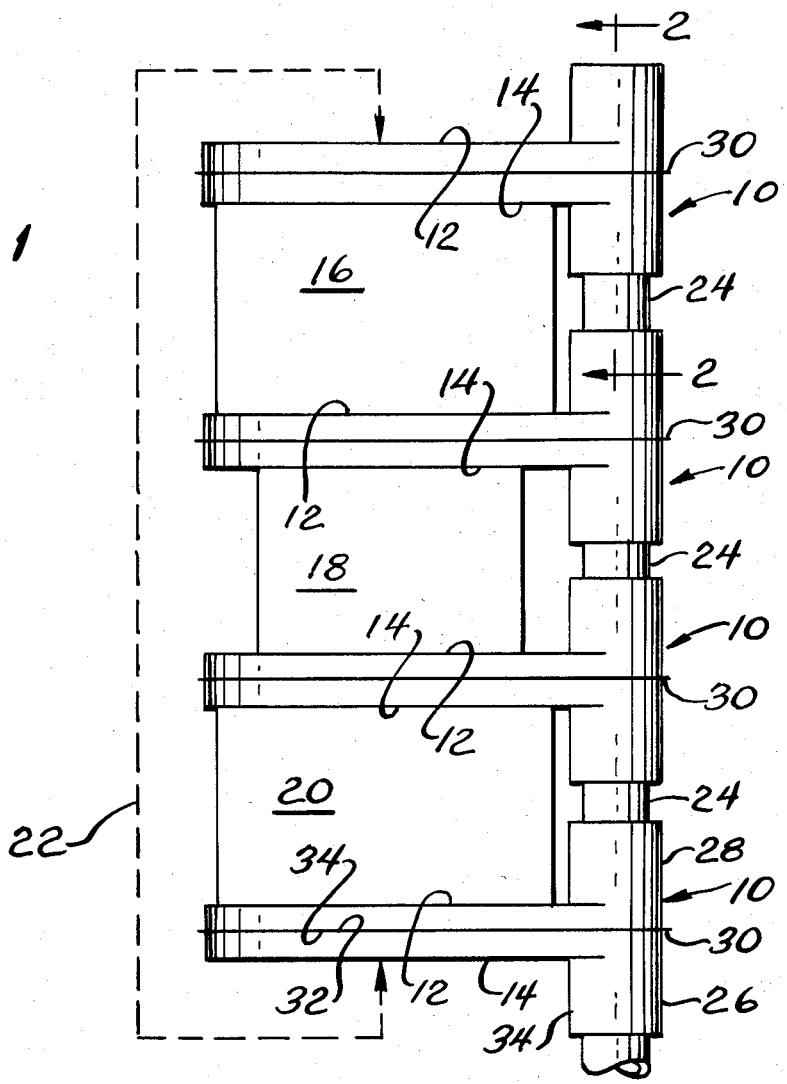
FIG. 1 is a side elevation of a stack of semiconductors employing heat sinks made according to the invention.

An exemplary embodiment of the invention is illustrated in FIG. 1 and with reference thereto is seen to include four heat sink structures, each generally designated 10, made according to the invention, although greater or lesser numbers could be used. Each heat sink structure 10 includes oppositely facing surfaces 12 and 14 which are adapted to make good electrical and thermal contact with an electrode of a semiconductor such as the semiconductors shown at 16, 18 and 20.

The endmost heat sink structures 10 in the stack are acted upon by any known and conventional form of clamp, shown schematically at 22 to hold the heat sink structures 10 and semiconductors 16, 18 and 20, in assembled relation.

As will be described in greater detail hereinafter, each heat sink structure 10 includes means for circulating a fluid coolant in proximity to the surfaces 12 and 14 for the purpose of absorbing heat generated by the abutting semiconductor 16, 18, or 20. In the usual case, the heat sink structures 10 of a stack will be interconnected in one or more flow paths for the coolant. Thus, conduits 24 in the form of plastic tubing or other insulating material extend between the heat sink structures 10 for the purpose of establishing the desired flow path, which, as will be seen, may be parallel flow, serial flow, or even combinations of the two.

Each heat sink 10 is made up of two elements 26 and 28 formed of a highly electrically and thermally conductive material. The element 28 includes the surface 12 while the element 26 includes the surface 14 and together they sandwich a thin sheet 30 of insulating or dielectric material between a planar surface 32 on the element 26 and an identically sized and shaped planar surface 34 on the element 28. Thus, it can be appreciated that the semiconductors 16, 18 and 20 are all electrically isolated from each other by reason of the disposition of the electrically insulating sheet 30 in the heat sink 10 interposed between any two adjacent ones of the semiconductors. This enables the heat sinks 10 to be made quite thin.

Figure 4:
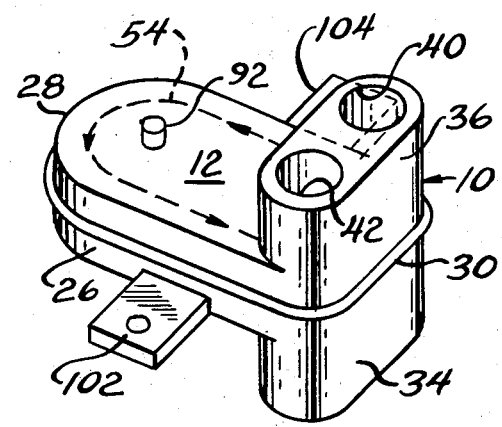
FIG. 4 is a perspective view of an individual heat sink structure.

As seen in FIGS. 1 and 4, each heat sink 10 is somewhat elongated (in the direction from left to right as viewed in FIG. 1) and at one end, the elements 26 and 28 include respective necks 34 and 36 which extend from the surfaces 14 and 12 respectively away from the planar surfaces 32 and 34 and generally transverse to the latter. By means to be described, the necks 34 and 36 receive the tubes 24 and serve as parts of inlet and/or outlet structures.

Figure 2:
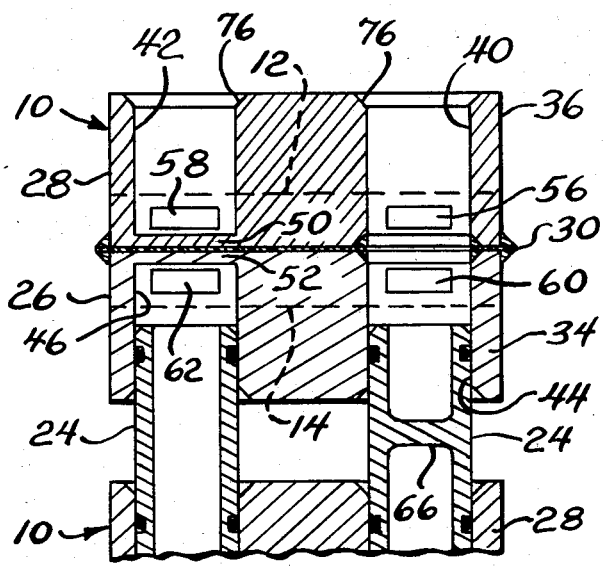
FIG. 2 is a sectional view taken approximately along the line 2—2 in FIG. 1.
Figure 3:
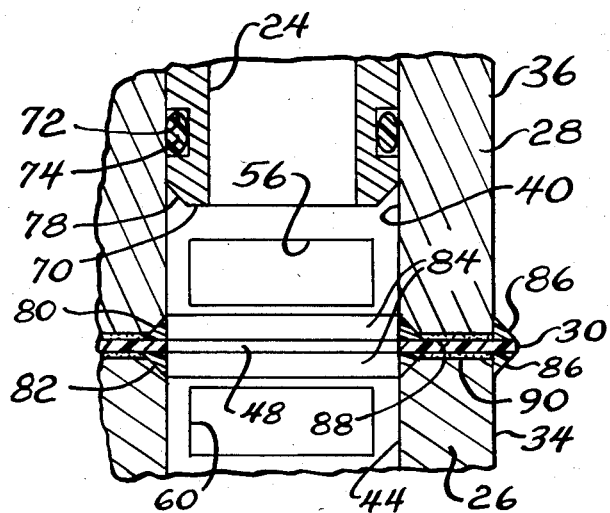
FIG. 3 is an enlarged, fragmentary view of a junction between heat sink elements.

Referring now to FIGS. 2, 3 and 4, the neck 36 and the element 28 is provided with two parallel bores 40 and 42 which define fluid ports. Similarly, the neck 34 is provided with bores 44 and 46. The bores 40 and 44 are aligned with each other as best seen in FIG. 2 as are the bores 42 and 46. As will become apparent hereinafter, the ports defined by the bores 40-46 may be variously used as inlets or outlets depending upon the fluid circulation pattern desired.

In some cases, the bores will be through bores as in the case of the bores 40 and 44. When such is the case, as seen in FIG. 3, the insulating sheet is provided with an aligned aperture 48 so that fluid communication between the bores 44 and 40 is established.

In other cases, as in the case of the bores 42 and 46, as seen in FIG. 2, the adjacent ends of the bores 42 and 46 are closed by webs 50 and 52 integral with the body of the associated heat sink element 28 and 26 respectively.

As shown schematically in FIG. 4, each of the elements 26 and 28 has an internal conduit 54 through which a coolant may pass in close proximity to either the surface 12 or the surface 14, as the case may be. The conduit 54, in the case of the element 28 extends between the bore 40 and the bore 42 and is in fluid communication with the same by respective ports 56 and 58 opening to the bores 40 and 42 in close adjacency to the planar surface 34. Similar ports 60 and 62 connect the conduit 54 within the element 26 with the bores 44 and 46 respectively.

FIG. 2 illustrates that one of the tubes 24 at the righthand side of the Fig. can include a plug 66 when serial flow of the coolant is desired. In this case, the upper end of the bore 40 would be plugged by means (not shown) and fluid could be introduced into the bore 42. The fluid would then enter the conduit 54 via the port 58 and emerge into the bore 40 through the port 56. Since the bore 40 is in fluid communication with the bore 44 through the aperture 48 in the insulating sheet 30, the fluid can then flow to the port 60 and enter the conduit 54 associated with the element 26. Such a path of flow will be mandated by the presence of the plug 66.

Figure 6:
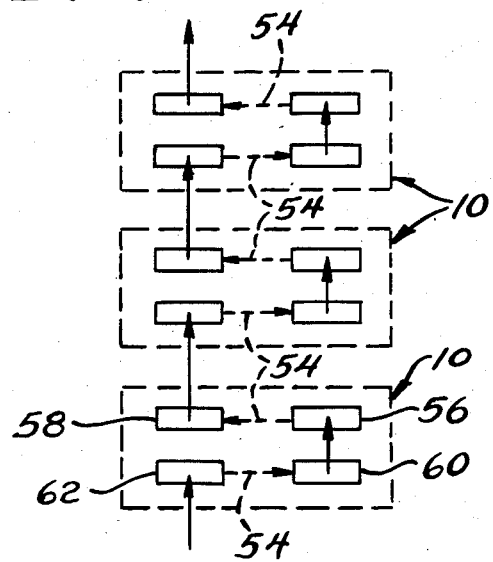
FIG. 6 is a schematic illustrating how heat sink structures made according to the invention may be connected for serial flow of a coolant.
Figure 7:
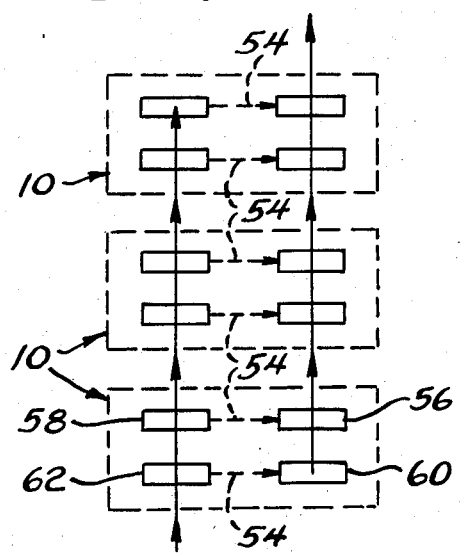
FIG. 7 is a view similar to FIG. 6 but illustrating parallel flow of the coolant.

Fluid emerging from the conduit 54 in the element 26 will exit the port 62 into the bore 46 and then into the tube 24 to flow on to the next heat sink 10 in the stack.

Where parallel flow rather than serial flow is desired, the plugs 66 are omitted as are the webs 50 and 52. An additional aperture 48 in the insulating sheet 30 is then located in alignment with the bores 42 and 46. In such a case, the aligned bores serve as manifolds, one set of aligned bores acting as an inlet manifold and the other acting as an outlet manifold. A serial flow arrangement such as depicted in FIG. 2 is shown schematically in FIG. 6 while a parallel flow arrangement as mentioned immediately preceding is shown schematically in FIG. 7.

FIG. 3 also illustrates means by which the tubes 24 interconnect and sealingly engage adjacent heat sinks 10. In particular, adjacent each end 70 (only one of which is shown) of each tube 24, the same includes an annular, outwardly opening groove 72. An O-ring seal 74 is disposed in each such groove and will sealingly engage the corresponding bore such as the bore 40 as shown in FIG. 3. To facilitate introduction of the tubes 24 into the bores 40-46, their ends remote from the planar surfaces 32 or 34 as the case may be are slightly beveled as seen at 76 in FIG. 2. By the same token, the ends 70 of the tubes 24 may be beveled as shown at 78 in FIG. 3.

The insulating sheet 30 is selected to have the desired insulating quality for the expected potential difference between the heat sink elements 26 and 28 separated thereby. Frequently, the material of which the sheet 30 will have significantly better insulating qualities than the coolant, typically oil, being circulated through the heat sinks 10. Thus, it may be desirable to provide for improved insulation where the elements 26 and 28 confront each other at the coolant path.

As shown in FIG. 3, the bores 40 and 44 are provided with respective reliefs 80 and 82 in the form of bevels adjacent the opening 48 in the sheet 30. The reliefs 80 and 82 are then filled with a body of suitable dielectric material 84 for the purpose of increasing the electrical length of the gap between the elements 28 and 26 at that point.

Similarly, because conditions external to the stack, such as relative humidity, may affect the insulating quality of the gap on the exterior of each heat sink across the sheet 30, the sheet 30 is shaped similarly to but somewhat larger than the shape of the planar surfaces 32 and 34 such that the sheet 30 extends beyond the periphery of each of the elements 26 and 28 around the entire periphery of each as can be seen in FIGS. 1, 2 and 4. A further body 86 of dielectric material can be located on each side of the sheet 30 to extend from the edge thereof to the adjacent element 26 or 28, as the case may be.

In a preferred embodiment, the bodies 84 and 86 of dielectric material may be formed of an adhesive which is additionally layered as shown at 88 and 90 on both sides of the sheet 30 and further serves to bond the elements 26 and 28 and the planar surfaces 32 and 34 thereof to the sheet 30.

Figure 5:
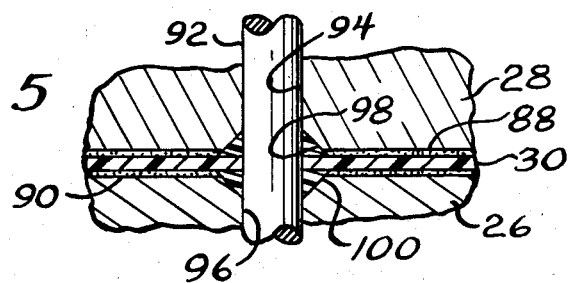
FIG. 5 is an enlarged, fragmentary view of another portion of the heat sink structure.

In some instances, the semiconductors 16, 18 and 20 include means (not shown) for receipt of locating pins 92 (FIG. 4) extending from the surface 12 or 14 as the case may be. Such locating pins 92 are made of insulating material and as seen in FIG. 5 may be received in aligned bores 94 and 96 in the elements 26 and 28. Reliefs 98 and 100 in the form of bevels are formed at adjacent ends of the bores 94 and 96 and likewise receive the dielectric adhesive as seen in FIG. 5 to increase the electrical gap at the location of the locating pins 92.

To facilitate connection to differing electrical potentials, the element 26 may include a terminal tab 102 as seen in FIG. 4 while the element 28 may include a terminal tab 104.

From the foregoing, it will be appreciated that a heat sink made according to the invention provides for excellent cooling of semiconductors in a stack without sacrificing the ability to have the semiconductors operating at different potentials. By separately cooling each semiconductor contacting surface 12 and 14 by reason of independent flow paths for coolant through the elements 26 and 28, excellent heat transfer is obtained. At the same time, electrical isolation is maintained without sacrificing the rate of heat transfer or unnecessarily increasing the size of the sinks through the use of the thin sheet 30 of insulating material interposed between the elements 26 and 28 of each heat sink 10.

The heat sink construction lends itself to the provision of plural types of coolant flow arrangements and in areas where the length of the electrical gap between components operating at different potentials is of concern, the use of a dielectric adhesive provides for the desired increase in the gap as well as secures the components of each heat sink 10 together in assembled relation.

I claim:

1. A heat sink structure comprising:
   a thin sheet of electrical insulating material;
   first and second electrically conductive heat sink elements each having a planar surface and an opposite side configured to make good electrical and thermal contact with a semiconductor, each said heat sink element having a fluid inlet and a fluid outlet spaced from said inlet and an internal conduit interconnecting said inlet and said outlet and said conduit being in heat transfer relation to said opposite side, and elements sandwiching said sheet between said planar surfaces; and
   means bonding said planar surfaces to said sheet.

2. The heat sink structure of claim 1 wherein the inlets and outlets are defined by necks extending away from the respective planar surfaces, the necks on one of said elements being aligned with the necks on the other element.

3. The heat sink structure of claim 2 wherein each said conduit interconnects the necks on the associated element in close proximity to the associated planar surface.

4. The heat sink structure of claim 2 wherein at least one neck on one element has a through bore aligned with a through bore in the aligned neck in the other element; an aperture in said sheet aligned with said through bores, each of said through bores, adjacent said sheet having a relief, and dielectric material in said reliefs.

5. The heat sink structure of claim 4 wherein said dielectric material is an adhesive further serving as said bonding means.

6. A semiconductor stack comprising a plurality of "X" heat sink structures of claim 2 in aligned but spaced relation, a plurality of "X-1" semiconductors, each semiconductor being disposed between two of said heat sink structures and engaging one of said opposite sides of each; clamping means acting on the endmost ones of said heat sink structures in said stack to clamp the heat sink structures and semiconductors in assembled relation; and tubes sealingly received in facing necks of adjacent heat sink structures in said stack to establish a flow path(s) for coolant through said conduits in said stack.

7. The stack of claim 6 wherein said tubes have opposed ends received in said necks and peripheral, outwardly opening grooves adjacent said opposed ends; an O-ring seal in said grooves.

8. The heat sink structure of claim 1 wherein said planar surfaces are substantially identical in size and shape and said sheet is of similar shape and greater size and extends beyond the periphery of said planar surfaces around the entire periphery of said elements.

9. The heat sink structure of claim 8 further including dielectric material on both sides of said sheet and about the periphery thereof and extending to said periphery of said elements.

10. The heat sink structure of claim 9 wherein said dielectric material is an adhesive further serving as said bonding means.

11. The heat sink structure of claim 1 wherein said bonding means is an adhesive.

12. A heat sink structure comprising:
    a thin sheet of electrical insulating material;
    first and second elongated, thin, electrically conductive heat sink elements each having a planar surface and an opposite side configured to make good electrical and thermal contact with a semiconductor, each said heat sink element having a fluid inlet and a fluid outlet spaced from said inlet and an internal conduit interconnecting said inlet and said outlet, said conduit being in heat transfer relation to said opposite side, said inlets and outlets being defined by necks extending from said opposite sides generally transverse to said planar surface and at an end of the associated element, said elements sandwiching said sheet between said planar surfaces; and
    dielectric adhesive bonding said planar surfaces to said sheet.

* * * * *